(12) United States Patent
Huang et al.

(10) Patent No.: US 11,115,130 B1
(45) Date of Patent: Sep. 7, 2021

(54) WAVELENGTH CONTROL AND MONITOR FOR DENSE WAVELENGTH DIVISION MULTIPLEXING (DWDM) SILICON PHOTONIC RECEIVER

(71) Applicant: HEWLETT PACKARD ENTERPRISE DEVELOPMENT LP, Houston, TX (US)

(72) Inventors: Tsung Ching Huang, Palo Alto, CA (US); Jinsung Youn, Palo Alto, CA (US); Peter Jin Rhim, Palo Alto, CA (US); Marco Fiorentino, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/925,202

(22) Filed: Jul. 9, 2020

(51) Int. Cl.
| H04J 14/02 | (2006.01) |
| H04B 10/69 | (2013.01) |
| H04B 10/079 | (2013.01) |
| H03M 1/66 | (2006.01) |
| H03M 1/12 | (2006.01) |

(52) U.S. Cl.
CPC ....... *H04B 10/69* (2013.01); *H04B 10/07955* (2013.01); *H04J 14/02* (2013.01); *H03M 1/12* (2013.01); *H03M 1/66* (2013.01)

(58) Field of Classification Search
CPC .............. H04B 10/07955; H04B 10/40; H04B 10/564; H04B 10/69; H04J 14/02
See application file for complete search history.

(56) References Cited

U.S. PATENT DOCUMENTS

| 9,766,403 B2 | 9/2017 | Jiang |
| 10,256,606 B2 | 4/2019 | Hu et al. |
| 10,505,341 B2 | 12/2019 | Tian et al. |
| 2002/0039470 A1* | 4/2002 | Braun ................ G02B 6/29383 385/50 |

(Continued)

OTHER PUBLICATIONS

Dong, P.; "Silicon Photonic Integrated Circuits for Wavelength-division Multiplexing Applications"; IEEE Journal of Selected Topics in Quantum Electronics; Jun. 7, 2016; 6 pgs.; vol. 22; issue 6; IEEE.

(Continued)

*Primary Examiner* — Dzung D Tran
(74) *Attorney, Agent, or Firm* — Sheppard Mullin Richter & Hampton LLP

(57) ABSTRACT

Techniques and circuitry for wavelength monitor and control are disclosed herein. The disclosed wavelength monitor and control circuitry and techniques are designed to realize a multi-channel DWDM optical link by using a photonic receiver that dynamically adjusts resonant wavelengths of the microring drop filter (MDF), as needed. The wavelength monitor and control circuitry can monitor and control the resonant wavelengths of multiple MDFs for a DWDM silicon photonics receiver with minimum power and area overhead. In an embodiment, circuitry for an optical receiver comprises an MDF having resonant wavelength for multiple DWDM channels, and circuitry to control and monitor the resonant wavelength of the MDF in real-time and in manner that compensates for deviation between actual resonant wavelength of the MDF and the incident optical wavelength of the MDF.

17 Claims, 5 Drawing Sheets

(56) References Cited

U.S. PATENT DOCUMENTS

| | | | | |
|---|---|---|---|---|
| 2005/0074209 A1* | 4/2005 | Baumann | ........... | G02B 6/12007 385/50 |
| 2012/0045163 A1* | 2/2012 | Wu | ........................ | G02F 1/225 385/2 |
| 2016/0065314 A1* | 3/2016 | Nazarathy | .............. | H04B 10/64 398/202 |
| 2019/0215089 A1* | 7/2019 | Huang | .................. | H04J 14/021 |

OTHER PUBLICATIONS

Papaioannou, S. et al.; "On-Chip Dual-Stream DWDM Eight-Channel-Capable Soi-Based MUX s/DEMUX s With 40-GHz Channel Bandwidth"; IEEE Photonics Journal; Dec. 18, 2014; 24 pgs.; vol. 7; issue 1; IEEE.

* cited by examiner

WAVELENGTH CONTROL AND MONITOR FOR DENSE WAVELENGTH DIVISION MULTIPLEXING (DWDM) SILICON PHOTONIC RECEIVER

STATEMENT OF GOVERNMENT RIGHTS

The invention(s) described herein were made with U.S. Government support under Prime Contract No. DE-AC52-07NA27344 awarded by DOE. The U.S. Government has certain rights in this inventions.

DESCRIPTION OF RELATED ART

Dense Wavelength Division Multiplexing (DWDM) is an optical multiplexing technology that can be used to increase bandwidth over existing fiber networks. DWDM typically consists of combining and transmitting multiple signals simultaneously, at different wavelengths, on the same fiber, thus multiplying the capacity of the physical medium. DWDM interconnects using nanophotonics, in general, can offer orders of magnitude improved bandwidth and energy efficiency over electrical interconnects. Emerging multi-core computing systems, which often require an interconnect fabric that provides high throughput at low power with a small footprint, may lend themselves to employ DWDM technology.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Various embodiments described herein are directed to circuitry and techniques for monitoring and tuning resonant wavelengths of a microring drop filter (MDF) in a dense-wavelength-division-multiplexing (DWDM) silicon photonic receiver. Due to manufacturing process variations, the resonant wavelength of a MDF can deviate from initial wavelength values (e.g., designated values). Such deviations in the resonant wavelengths can lead to further issues, such as causing a misalignment between incident optical wavelengths and respective MDF resonance wavelengths. Under extreme cases of the abovementioned misalignment, a DWDM optical link cannot be established. Misalignment is just an example of a circumstance where deviations in the MDF resonant wavelengths, left unaddressed, can be the root cause of catastrophic operational issues in a DWDM system. In order to address such concerns, the disclosed wavelength monitor and control circuitry and techniques are designed to realize a multi-channel DWDM optical link by using a photonic receiver that dynamically adjusts resonant wavelengths of the MDF, as needed. As will be described in detail below, the circuitry, as disclosed herein, monitors and controls the resonant wavelengths of multiple MDFs for a DWDM silicon photonics receiver with minimum power and area overhead.

As background, a MDF is a key element in a DWDM optical link, operating as a wavelength-selective optical device. For example, when the circumference of a MDF is an integer multiple of the wavelength of the incident light, the incident light can pass through the MDF and be coupled to the output waveguide (i.e. drop port). Multiple MDFs can therefore be used to filter out irrelevant high-speed optical bit-streams coming from the same fiber, using different optical wavelengths without interfering each other. The resonant wavelengths of each of the MDFs can then be specifically designed to match to the respective allocated wavelengths for different channels. Due to manufacturing process variations, however, the actual resonant wavelength of a fabricated MDF could deviate from its designated value. As an example, wavelength mismatches between incident optical wavelengths and the MDF resonant wavelengths can cause resonant wavelengths of MDFs in particular channels to shift from their initial values (e.g., values implemented at design time).

Figure 1:
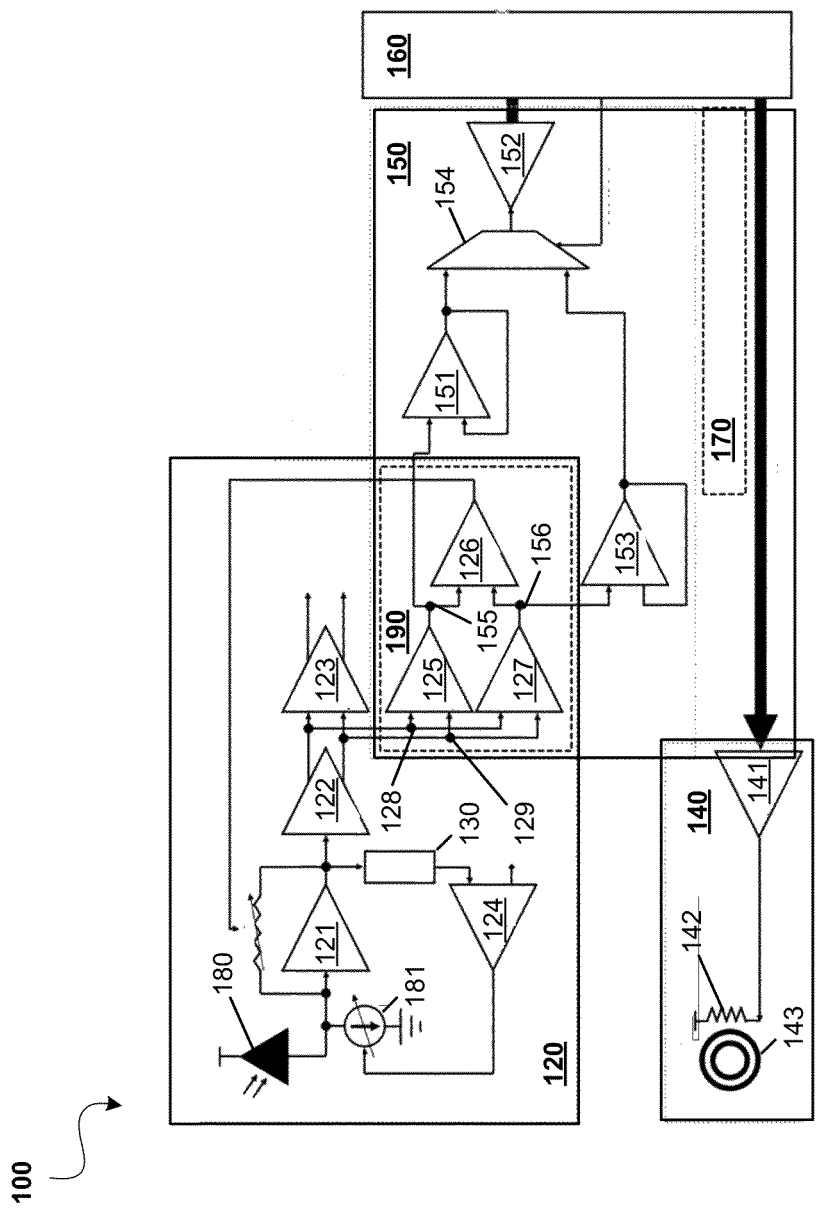
FIG. 1 is an example of circuitry for an optical receiver with circuitry for controlling and monitoring resonant wavelengths of a microring drop filter (MDF) in real-time, according to some embodiments.

Referring now to FIG. 1, an example architecture for circuitry 100 is shown. The circuitry 100 implements a photonic receiver including the resonant wavelength monitoring and tuning capabilities, as disclosed herein. According to the embodiments, the circuit 100 can be implemented (either partially or fully) as a silicon integrated circuit (IC) chip that is designed for operating as a photonic receiver in a DWDM optical system. Furthermore, as alluded to above, the circuitry 100 is distinctly designed to control and monitor the respective resonant wavelengths of MDFs (which are typically used in DWDM silicon photonic receivers) such that any detected deviations in the resonant wavelengths (e.g., from their initial values) can be adjusted in real-time by the circuitry 100. Often times, process variations of the MDFs are inevitable. Thus, the circuitry 100 allows as the photonic receiver to self-mitigate any unintended resonant wavelength drift in the MDFs that may deteriorate the overall performance and operation of the DWDM optical system.

FIG. 1 illustrates that the circuitry 100 can principally have four sections of circuitry (indicated by boxes), including: 1) optical receiver 120; 2) wavelength monitor 150; 3) wavelength controller 140; and 4) wavelength division multiplexing (WDM) digital logic controller 160 for monitoring and controlling the wavelength in real-time.

The circuitry of the optical receiver 120 includes components which implement the primary functions of a DWDM optical receiver. In detail, the elements and functionality of the optical receiver 120 are discussed in reference to FIG. 2 below.

Figure 2:
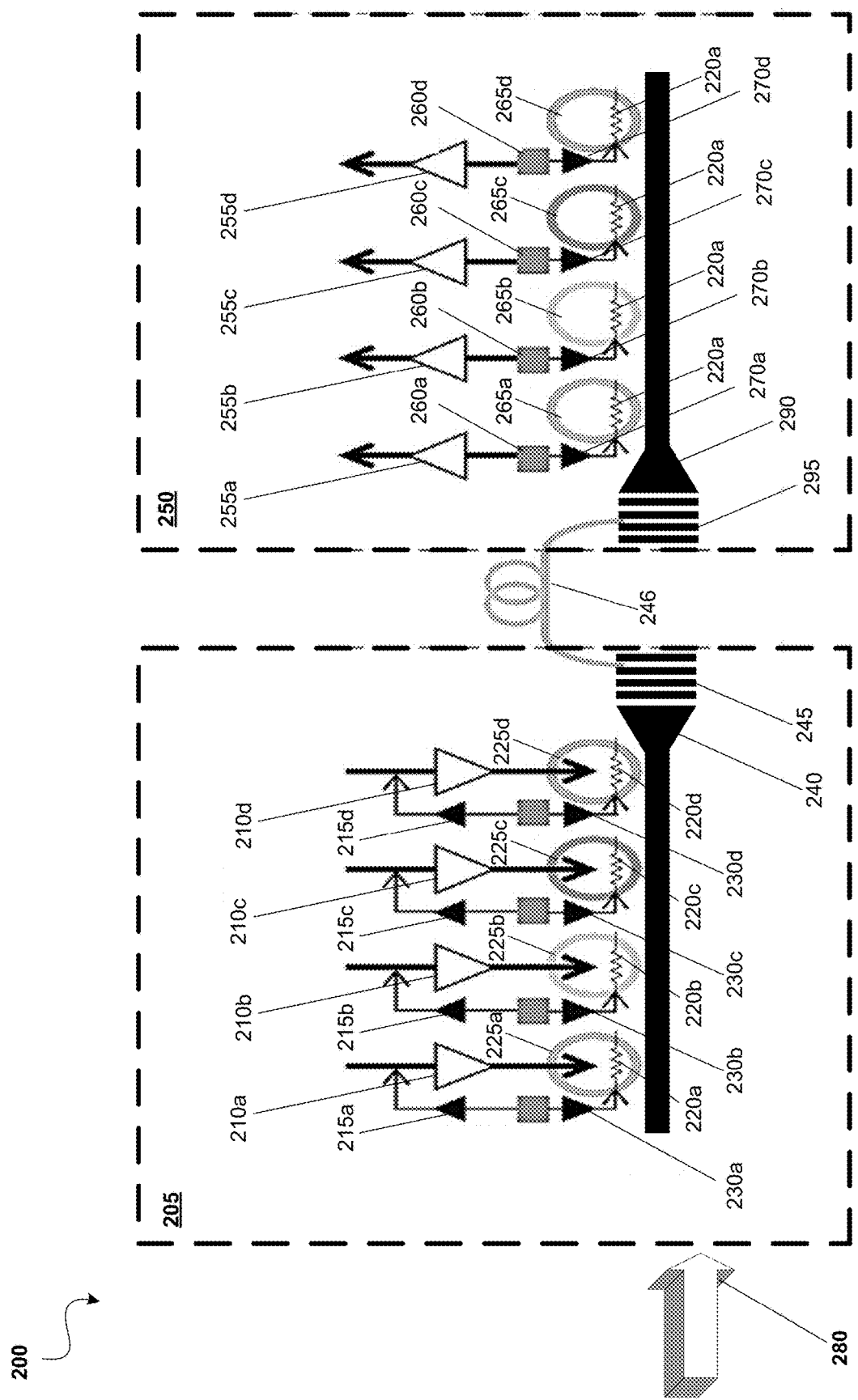
FIG. 2 is a conceptual diagram of an example of a Dense Wavelength Division Multiplexing (DWDM) silicon photonics optical system, according to some embodiments.

Generally speaking, the wavelength monitor 150 is configured to monitor the peak and dc signals of differential nodes at 128 and 129 in the optical receiver 120. These signals that are monitored by the wavelength monitor 150 can reflect detected wavelength shifts of the MDF 143. As an example, when the resonant wavelength of the MDF 143 shifts from $\lambda_0$ to $\lambda_1$ while the incident optical wavelength remains at $\lambda_0$, the optical power at the drop port of the MDF 143 decreases and the power level depends on the difference between $\lambda_0$ and $\lambda_1$. By measuring the optical power at the drop port of a MDF 143, the difference between the resonant wavelength of the MDF 143 and the incident optical wavelength can be observed. However, this method is more optimal for a single wavelength receiver. With a DWDM-based receiver configured for multiple wavelengths, the wavelength monitor 150 is configured for a more complex wavelength monitoring. The wavelength monitor 150 has the capability to monitor the resonant wavelengths of multiple MDFs for a DWDM silicon photonics receiver. An example of a DWDM-based receiver including multiple MDFs is depicted in FIG. 2.

Referring back to the illustrated example in FIG. 1, the wavelength monitor 150 can reuse components of the optical receiver 120, which provides advantages such as minimizing the power consumed by the circuitry and area overhead. For example, the wavelength monitor 150 implements a peak detector (PD) 125 and a direct current (dc) detector (DD) 127 (shown in detail in FIGS. 3A-3B) by reusing the building blocks of the automatic gain control (AGC) 190 portion of the optical receiver 120. As shown, the AGC 190 is composed of 125, 126, and 127, in the optical receiver 120. The AGC 190 is also used to automatically adjust the gain of the transimpedance amplifier (TIA) 121. A peak signal $V_{PEAK}$ at node 155 and dc signal $V_{DC}$ at node 156 are buffered using opamps 151 and 153. The opamps 151 and 153 can be configured as unity-gain buffers with small input capacitance (<10 fF) and multiplexed using an analog 2:1 multiplexer 154. The analog signals detected by the wavelength monitor 150 are further converted into digital signals that are sent to the WDM digital logic controller using a successive-approximation (SAR) analog-to-digital converter (ADC) 152.

The wavelength controller 140 can include a resistive heater 142 positioned proximal to the MDF 143 on the chip. Accordingly, the resistive heater 142 serves as a source of localized heat, which is tunable using a current-steering digital-to-analog (IDAC) converter 141 of wavelength controller 140 (co-located on the chip). The IDAC 141 functions as a tunable current sink with which the current of the resistive heater 142 can be digitally controlled by the WDM digital logic controller 160. In other words, the IDAC 141 can be tuned to effectuate a particular temperature that is dissipated by the resistive heater 142. Generally, the resonant wavelength shifts toward the longer wavelengths as the temperature increases. In turn, the resonant wavelength of the MDF 143 can be shifted in a particular manner by this heat (which is precisely controlled vis-à-vis the current of the resistive heater 142) in a manner that compensates for any deviation in the resonant wavelength at the MDF 143.

The WDM digital logic controller 160, in general, can adjust a wavelength compensation that is imparted by the wavelength controller 140 based on an amount of wavelength shift at MDF 143 as detected by the wavelength monitor 150. The WDM digital logic controller 160 can take digital signals from the SAR-ADC 152 to be aware of the peak and DC signals at nodes 155 and 156, which reflect any wavelength shifts of the MDF 143. In response to any detected wavelength shift, the WDM digital logic controller 160 can vary the digital control words sent to the current-steering IDAC 141 at the wavelength controller 140. In FIG. 1, the WDM digital logic controller 160 is implemented either monolithically on the same chip with the circuitry 100. In some embodiments, the WDM digital logic controller 160 can be implemented on a separate field-programmable-gate-array (FPGA) chip. In this embodiment, the WDM digital logic controller 160 can use electrical I/O such as $I^2C$ (inter-integrated circuit) or GPIO (general purpose input/output) to read and/or send digital command words for the wavelength monitor 160 and the wavelength controller 140.

The WDM digital logic controller 160 can be implemented as a processing device that is capable of various functions including analyzing peak signals and dc signals received as input from the wavelength monitor 150, outputting current control signals to the wavelength controller 140 and performing corresponding calculations (e.g., determining an amount of detected wavelength deviation from peak/dcsignals; determining an amount of current based on the detected wavelength deviation). According to the embodiments, the WDM digital logic controller 160 is configured for performing several aspects of the disclosed circuitry 100, for instance determining a wavelength shift (based on monitored signals), and determining a compensation factor (e.g., current to apply to resistive heater to generate wavelength shift).

As an example, in operation, the compensation factor can be calculated, or otherwise determined, based on a mathematic relationships between the characteristics of: 1) dc signals and wavelength deviation; and 2) current/resistive heater temperature and wavelength shift. As such, data structures that represent these temperature-based relationships (or the mathematical relationships themselves) can be programmed into the WDM digital logic controller 160. Using these relationships, the WDM digital logic controller 160 can derive a value for the compensation factor, namely an amount of current output to the wavelength controller 140 (based on detected wavelength deviation). In an embodiment, the WDM digital logic controller 160 is programmed with a look-up table which defines correlations between a measured wavelength deviation and a output current (e.g., an amount of wavelength shift needed to compensate for the wavelength deviation). That is, the WDM digital logic controller 160 can be configured to determine an appropriate compensation factor that is sent to the wavelength controller 140 to adjust the resonant wavelength of the MDF 143 in real-time in a manner that compensates for the wavelength deviation that is determined using the wavelength monitor 150.

In FIG. 2, a diagram of a DWDM system 200 is illustrated, serving as an example of a system that can utilize a multi-wavelength laser configured with the disclosed wavelength control and monitoring features. Generally, the DWDM system 200 can be described as a five-channel DWDM CMOS transceiver including multiple carrier-injection microring modulator. The microring modulator-based DWDM silicon nanophotonic link can be driven by comb laser 280. Further, FIG. 2 shows that the DWDM silicon nanophotonic links integrates both photonic and CMOS chips. In the example, DWDM system 200 incorporates:

CMOS drivers 210a-210d within the optical transmitter (Tx) module 205; and CMOS drivers 255a-255d within the optical receiver (Rx) module 250. The DWDM system 200 can provide a scalable and cost-effective solution towards a terabit interconnect.

The DWDM system 200 employs wavelength-selective optical components, such as carrier-injection microring modulators. As shown, an optical transmitter (Tx) module 205 includes microring modulators 225a-225d. An optical receiver (Rx) module 250 includes microring modulators 265a-265d. The microring modulators 225a-225d and 265a-265d play a critical role in DWDM nanophotonic links, and require sophisticated wavelength tuning and pre-emphasis driving in order to align the resonance wavelength with the laser 280, as well as to overcome the intrinsic bandwidth limitation to achieve higher data rates. Thus, the DWDM system 200 utilizes energy-efficient CMOS chip and 3D integrated with DWDM photonic chip, in order to provide wavelength tuning, pre-emphasis driving and signal amplification.

Also, FIG. 2 illustrates that the DWDM system 200 includes an optical link, shown as optical fiber 246, that is physically coupling the optical Tx module 205 for transmitting information modulated onto optical signals that are received by the optical Rx module 250. Further, in the illustrated example, the optical Tx module 205 includes a multi-wavelength laser, shown as comb laser 280, that produces light at various wavelengths for the optical signal.

The optical Tx module 205 further includes several key components for transmitting an optical signal: the multi-wavelength light source, shown as comb laser 280; optical modulators, shown as several cascading silicon microrings 225a-225d. The optical Rx module 250 is shown to include several key components for receiving an optical signal: optical demultiplexer, shown as microring resonator filters 265a-265d; and photodetectors 260a-260d. As alluded to above, DWDM technology is widely used in fiber-optic telecommunications to increase the system capacity (e.g., without replacing existing backbone optic network). A mechanism for increasing capacity can be using a multi-wavelength light source at the optical Tx module 205, for instance comb laser 280. The optical Tx module 205 can multiplex N independent data streams, serialize them, and modulate them onto N different wavelengths $\lambda_1 \ldots \lambda_N$ of light, typically having 50 GhZ-100 GHz of channel spacing. For example, mirroring resonator 225a can be set to have a resonance wavelength $\lambda_1$, microring resonator 225b set to wavelength $\lambda_2$, microring resonator 225c set to wavelength $\lambda_3$, and microring resonator 225d set to wavelength $\lambda_N$. These data streams generated by the optical Tx module 205 can then be sent together and propagated through waveguide 240, which is coupled to the optical fiber 246 via optical coupler 245. The optical signals (data streams) can be propagated through optical fiber 246 (e.g., optical cable), for a long distance (e.g., kilometers). Subsequently, at the optical Rx module 250 the optical demultiplexer can include microring filters 265a-265d that are tuned for the N corresponding wavelengths, namely $\lambda_1 \ldots \lambda_N$.

As seen in FIG. 2, the optical demultiplexer can be implemented as multiple microring drop filters (MDF) 265a-265d that can be used to demultiplex the optical signal at a corresponding wavelength. For example, microring drop filter 265a can be set to filter wavelength $\lambda_1$, microring drop filter 265b can be set to wavelength $\lambda_2$, microring drop filter 265c can be set to wavelength $\lambda_3$ and microring drop filter 265d can be set to wavelength $\lambda_N$. A compact and scalable DWDM photonic link can be implemented by using cascading silicon microring resonators to implement the modulator 225a-225d (at the Tx-end) and the filters 265a-265d (at the Rx-end) with slightly different radii to a single waveguide. In addition, the optical Rx module 250 includes a series of photodetectors 260a-260d, where each photodetector 260a-260d is correspondingly connected to a respective microring filter 265a-265d. SiGe APDs can be used as photodetectors 260a-260d. The microring resonator filters 265a-265d and the photodetectors 260a-260d can serve as the de-multiplexer and de-serializer to convert the multi-wavelength serialized optical signals back to N independent electrical data streams simultaneously.

In order to realize chip-scale DWDM nanophotonic interconnects for the system 200, the use of microring resonators offers multiple advantages, such as a small footprint (e.g., 10 μm in diameter) and low driving power. As shown in FIG. 2, microring resonators can be configured to implement both the optical modulator 225a-225d at the Tx-side 205 and the optical filters 265a-265d at the Rx-side 250. However, silicon microring resonators have a resonance wavelength $\lambda$ dependence. Thus, stabilizing the resonant wavelengths is imperative to proper function of the microring resonators, and in turn, the optical modulator and demultiplexer in the system. By implementing the filters 225a-225d of the optical Rx module 250) with the disclosed wavelength control and monitoring circuitry (shown in FIG. 1), the receiver can self-adjust in real-time (e.g., during operation) to compensate for wavelength deviation from initial resonant wavelengths of the MDFs (e.g., set at design time).

Figure 3:
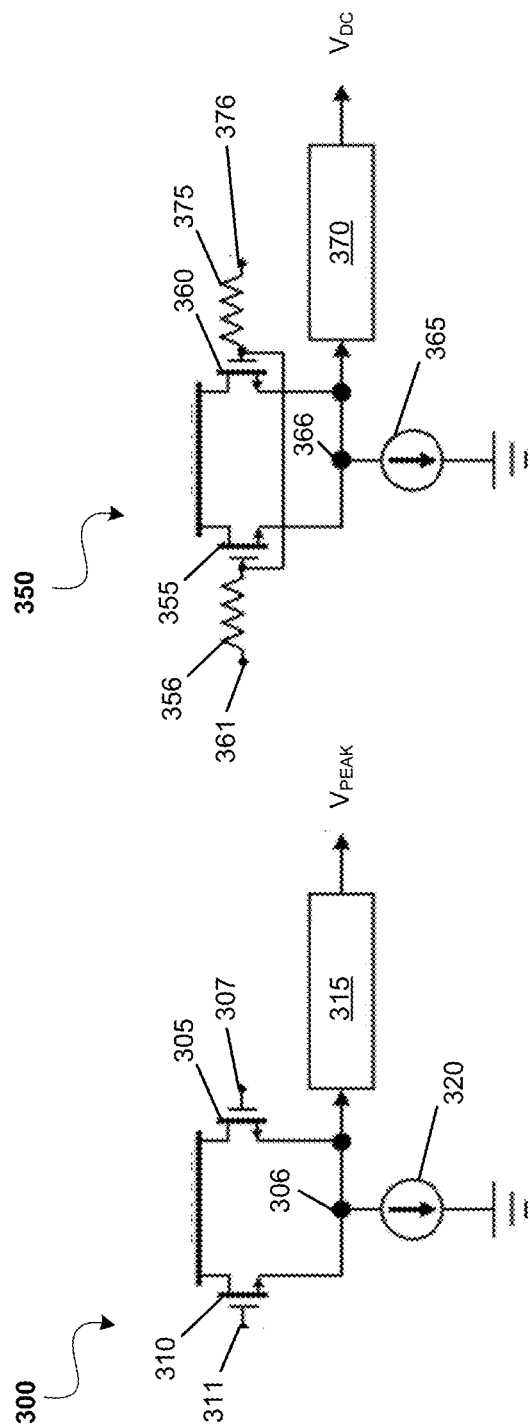
FIG. 3A is an example of circuitry for a peak detector (PD) that can be implemented within the circuitry for an optical receiver shown in FIG. 1, according to some embodiments.
FIG. 3B is an example of circuitry for a direct current detector (DD) that can be implemented within the circuitry for an optical receiver shown in FIG. 1, according to some embodiments.

In FIG. 3A, an example of circuitry 300 for implementing the peak detector (PD) of the wavelength monitor (shown in FIG. 1) is depicted. The PD 300 can include a differential common-drain (CD) amplifiers 305, 310 with the differential outputs tied together. Also, a low-pass filter (LPF) 315 can receive the output amplitude of $V_{CD}$ at node 306 from the amplifiers 305, 310 to generate an analog voltage $V_{PEAK}$ as its output. The output amplitude of $V_{CD}$ as well as the analog voltage output $V_{PEAK}$ vary with the signal amplitude (swing) of the inputs $V_{IN+}$ at node 311 and $V_{IN-}$ at node 307.

Figure 4:
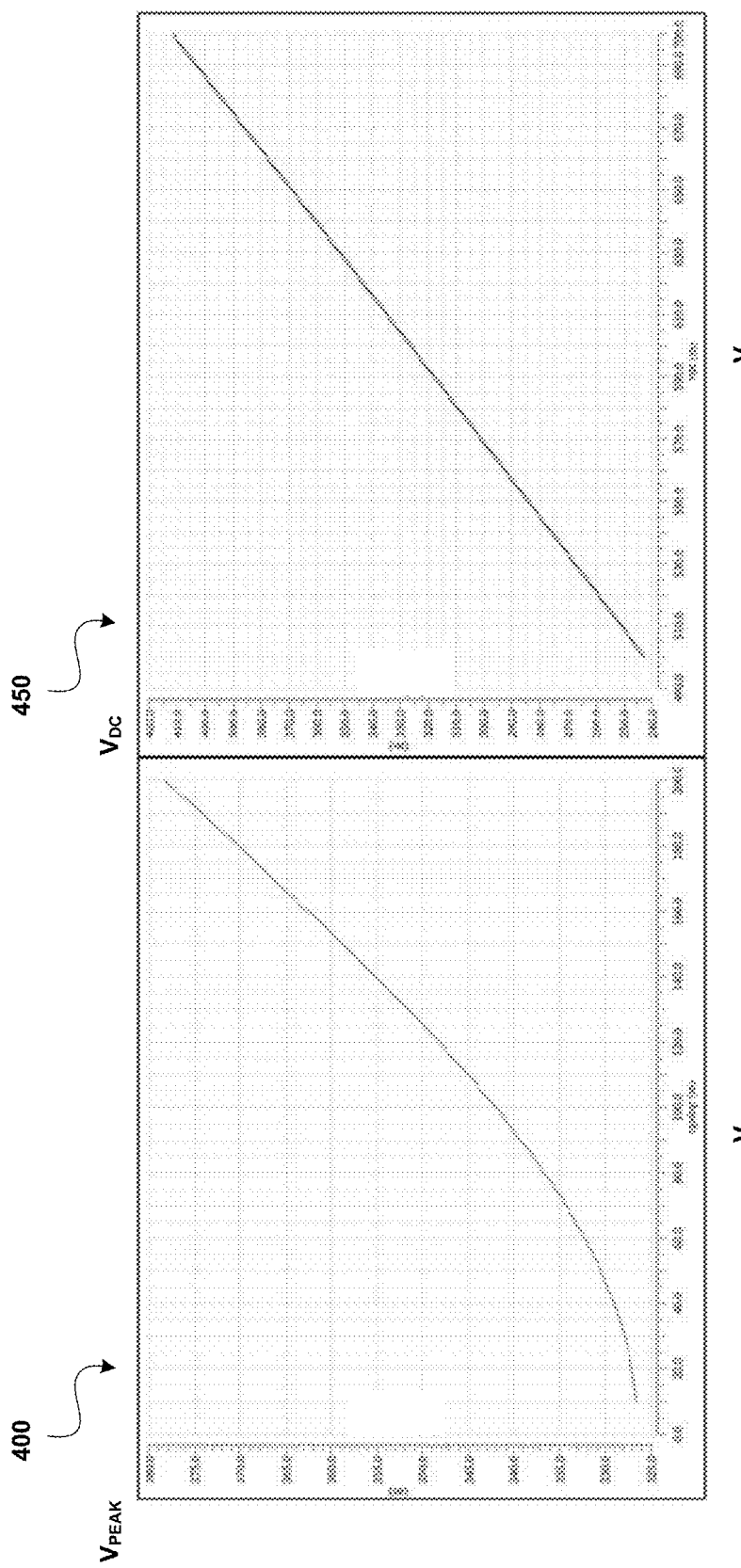
FIG. 4A is a graphical representation of a relationship between single-ended input amplitude versus the analog dc voltage output of the PD circuitry shown in FIG. 3A.
FIG. 4B is a graphical representation of a relationship between common-mode dc voltage of differential random input signals versus the analog dc voltage output of the DD circuitry shown in FIG. 3B.

This is relationship between single-ended input amplitude (10-200 mV) versus the analog dc voltage output of the peak detector is illustrated graphically as graph 400 in FIG. 4A. Graph 400 shows an example of simulated characteristics of the PD between the input amplitude $V_{INAMP}$ (10-150 mV) and the output analog voltage $V_{PEAK}$. Since the voltage gain $A_{CD}$ of a CD amplifier is less than unity and strongly depends on the body effects, the slope of $V_{PEAK}$ versus $V_{INAMP}$ curve in FIG. 4A is less than unity and becomes non-linear when $V_{INAMP}$ is small (<100 mV). Since $V_{PEAK}$ monotonically increases with $V_{INAMP}$, the digitized representation of $V_{PEAK}$ can be used at SAR-ADC output as an indication of the received optical power, as well as the wavelength difference between the incident light and the MDF resonance.

In FIG. 3B, an example of circuitry 350 for implementing the direct current detector (DD) of the wavelength monitor (shown in FIG. 1) is depicted. The circuitry 350 is configured as two series resistors to generate $V_{INCM}$. As seen, circuitry 350 includes resistor 356 which receives $V_{IN+}$ as input at node 361, and resistor 375 which receives $V_{IN-}$ as input at node 376. Output signals from resistors 356 and 375 are input into the differential common-drain (CD) amplifiers 355 and 360, respectively. Also, a low-pass filter (LPF) 370 can receive the output amplitude of $V_{CM}$ at node 366 from the amplifiers 355, 360 to generate an analog voltage $V_{DC}$ as its output. Common-mode voltage $V_{INCM}$ is extracted out of differential random input signals, which represents the average optical power received at a given resonance wavelength of the MDF.

This relationship between the common-mode/dc voltage of differential random input signals (500-700 mV) versus the analog dc voltage output of the dc detector is illustrated graphically as graph 450 in FIG. 4B. Graph 450 shows the simulated characteristics of input common-mode voltage $V_{INCM}$ versus the analog voltage output $V_{DC}$ as a linear relationship. $V_{DC}$ is digitized using a SAR-ADC with a good resolution (e.g., 8-bit), which allows reference to the digital $V_{DC}$ codes to know the average optical power received at drop port of the MDF.

Figure 5:
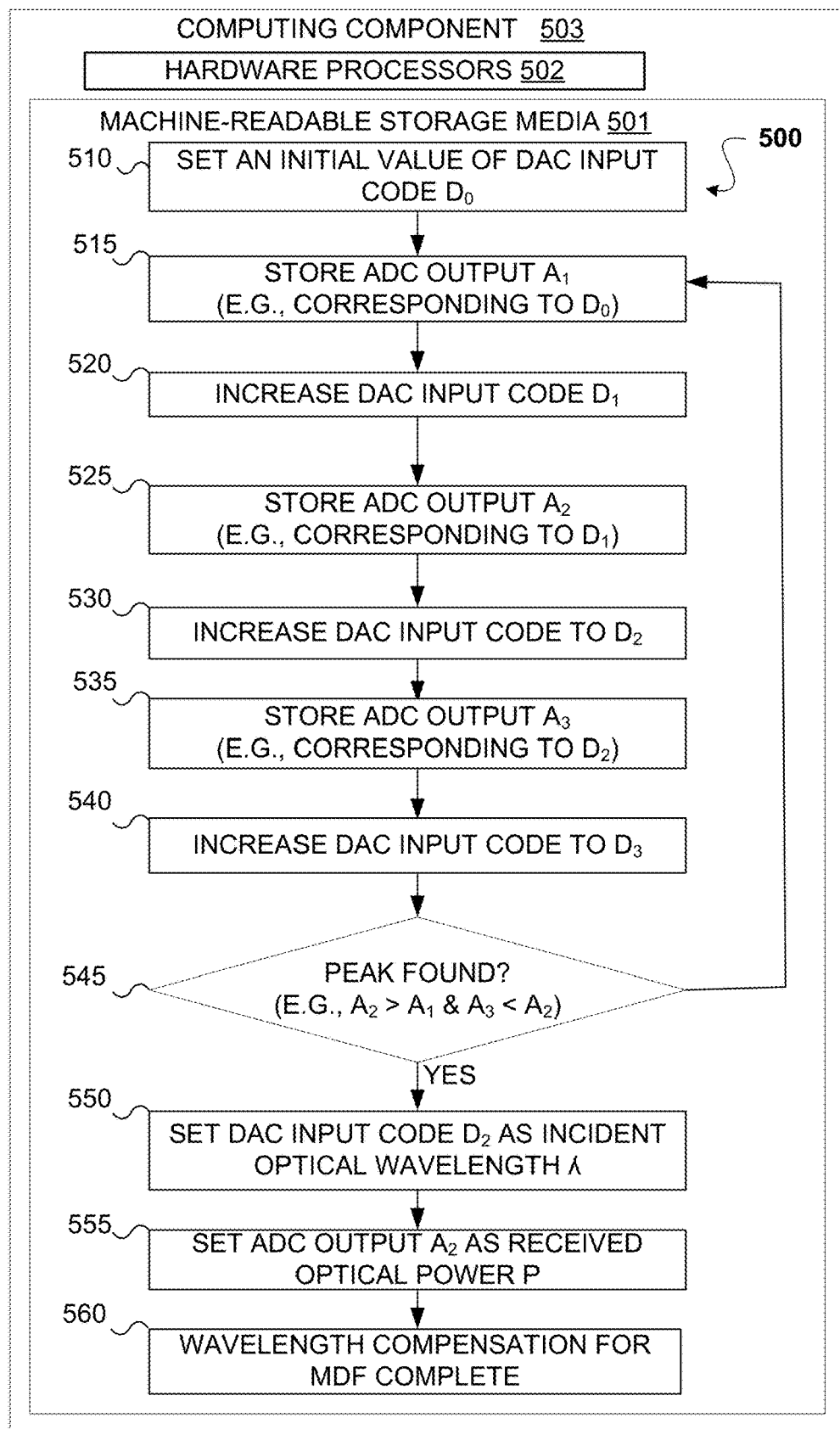
FIG. 5 is a flow diagram illustrating an example process implemented by a wavelength division multiplexing (WDM) digital logic controller of the circuitry shown in FIG. 1, according to embodiments of the disclosed technology.

Referring now to FIG. 5, a process 500 for determining wavelength shifts and subsequently controlling the wavelength compensation (based on the determined wavelength shift) is depicted. As seen in FIG. 5, the process 500 is illustrated as a series of executable operations in a machine-readable storage media 501 performed by a hardware processor 502. The computing component 503 can be the WDM digital logic controller of the circuitry (shown in FIG. 1), as previously described. The WDM digital logic controller uses the SAR-ADC output as a wavelength monitor and a current-steering DAC input code as a wavelength controller to observe the wavelength shifts of a fabricated MDF, and then determines the relative location of the MDF resonance wavelength R to the incident WDM wavelength λ. Subsequently, the WDM controller can digitally control adjusting the resonant wavelength of the MDF (with the heater currents) until the R MDF resonance wavelength matches the incident WDM wavelength λ.

The process 500 begins at operation 510, where the initial value of the DAC input code is set to $D_0$. The heater shifts the MDF resonance wavelength R towards the longer wavelengths by increasing the value of the DAC currents. In turn, by increasing the DAC input code the DAC current is also increased (thereby increasing the temperature at the resistor). Accordingly, the initial value of the DAC input to $D_0$ is set to a lower value in operation 510 in order to allow room for increasing the values of the DAC currents (increasing the temperature at the resistor) later in the process 500 to tune the MDF's resonant wavelength. For example, the value of $D_0$ can be set to 0. The DAC is a component of the WDM digital logic controller that operates as a tunable current-steering element, by enabling the WDM digital logic controller to generate an analog signal (based on the digital DAC code) that controls the current to the resistor (heating element).

Next, at operation 515, an ADC output $A_1$ is stored. The ADC output $A_1$ corresponds to the DAC input $D_0$ that was set in the previous operation 510. By storing the ADC output $A_1$, the WDC controller can link a resonant wavelength of the MDF to the initial DAC input of $D_0$. In the case where $D_0$ is set to the initial value of 0, it can be assumed that this wavelength corresponding to $D_0$ is an initial resonant wavelength of the MDF (before any wavelength compensation) because there is no analog signal output by the DAC applying a current to the resistor in order to effectuate temperature-based wavelength tuning to the MDF. In other words, $A_1$ can be considered the starting point of the MDF's resonant wavelength, prior to the process 500 performing adjustments to compensate for deviation from the incident wavelength. For purposes of discussion, storing values in process 500 can involve storing data in a memory (or similar storage element) of the WDM digital logic controller such that operations can be performed by the WDM controller using this data.

The process 500 moves to operation 520, where the DAC input code is set to another value $D_1$. As previously described, process 500 increases the value of the DAC input from its initial value of $D_0$. Referring back to the example, $D_1$ can be a value for the DAC code that causes the DAC to generate a current value (driving the resistor) that is larger than the value corresponding to $D_0$ by some static step size N. Therefore, the resistor current is also increased by that set step size N. Subsequently, at operation 525, the ADC output $A_2$ that corresponds to the DAC input $D_1$ is stored. As alluded to above, the output of the ADC is a digital value representing the resonant wavelength of the MDF that has been sensed by the wavelength monitor of the circuitry (shown in FIG. 1). In the digital form, the monitored wavelengths can be analyzed by the WDM digital logic controller. Thus, in operation 525 the WDC digital logic controller has a resonant wavelength of the MDF that corresponds to the DAC input of $D_1$.

At operation 530, process 500 continues to increase the generated DAC current (driving the resistor current) by setting the DAC input code to $D_2$. $D_2$ can be a value for the DAC code that causes the DAC to generate a current value (driving the resistor) that is larger than the value corresponding to $D_1$ by the same static step size N. Generally, as the DAC input code is increased from low to high in process 500, the temperature of the resistor correspondingly goes from low to high.

Thereafter, operation 535 stores the ADC output $A_3$ that corresponds to the DAC input code to $D_2$. The WDM controller has a resonant wavelength of the MDF that corresponds to the DAC input of $D_2$. Accordingly, after operation 535, the WDM digital logic controller has three resonant wavelengths of the MDF stored, namely the wavelength corresponding to ADC outputs $A_1$, $A_2$, and $A_3$ respectively.

In operation 540, the DAC input code can be set to another value $D_3$. Setting the DAC input code to $D_3$ can further increase the DAC current value (driving the resistor) from the current associated with the previous DAC code $D_2$ by the static step size N. Although process 500 is described to use a static N related to increasing the DAC input code, this is not intended to be limiting and the DAC input code can be increased using variable steps, a combination of static steps and variable steps, or other values as deemed appropriate.

Next, operation 545 determines which of the stored resonant wavelengths of the MDF, namely the wavelength corresponding to ADC outputs $A_1$, $A_2$, and $A_3$ constitutes the peak of the monitored signal. As previously discussed, the wavelength monitor of the circuitry senses a peak signal ($V_{PEAK}$) and dc signal ($V_{DC}$). Generally, monitoring the dc signal can be considered a coarse signal monitor that senses larger fluctuations in the analog signal to determine whether the signal is rising or falling. Conversely, monitoring the peak signal can be considered a fine monitor that senses very slight changes in the signal to narrow in on the signal's peak. DWDM demultiplexing is a sensitive scheme, since multiple wavelengths that may be very narrowly spaced from each other must be detected. Although only employing the coarse signal monitoring may be utilized in single channel systems, applying this coarse monitoring approach in a DWDM system with multiple close wavelengths (for more bandwidth) runs the risk of completely missing a signals' peak. Therefore, the disclosed circuitry implements a sophisticated monitoring approach, by both coarsely monitoring the dc signal and finely monitoring the peak signal to accurately detect the peak. Using the three sampled points of the monitored signal, namely ADC outputs $A_1$, $A_2$, and $A_3$, operation 545 can determine whether the signal's peak has been found. For example, the WDM digital logic controller can be programmed to compare $A_1$, $A_2$, and $A_3$ to each other in order to find the peak. That is, the WDM digital logic controller can determine if $A_2 > A_1$ and $A_3 < A_2$ which indicates that the signal has risen from $A_1$ to $A_2$, and then fell from $A_2$ to $A_3$. Thus, $A_2$ can be considered the inflection point, or peak of the signal. If $A_2$ is determined to be the peak in operation 545 (YES), then the peak has been found and the process 500 continues to 550.

In operation 550, the DAC output code $D_2$ is set as the incident optical wavelength ($\lambda_0$) of the MDF.

Then, at operation 555, the ADC output $A_2$ is set as the received optical power P. When the resonant wavelength of the MDF shifts from $\lambda_0$ to a different wavelength $\lambda_1$ (while the incident optical wavelength remains at $\lambda_0$) the optical power P at the drop port of the MDF decreases. The power level of P is dependent on the difference between $\lambda_0$ and $\lambda_1$. By measuring the optical power P at the drop port of a MDF, an amount of deviation between the MDF resonant wavelength $\lambda_1$ and the incident optical wavelength $\lambda_2$ is known. Accordingly, when WDM digital logic controller can use the DAC output code $D_2$ and the ADC output $A_2$ to determine that temperature-based wavelength compensation has been applied to the MDF such that there is no difference between the MDF resonant wavelength $\lambda_1$ and the incident optical wavelength $\lambda_0$, then the process 500 can proceed to operation 560.

Referring back to operation 545, if the peak is not detected, then the process 500 returns back to operation 515 in order to re-set the DAC input code values. In some embodiments, operations 515-545 can be performed iteratively until the signal's peak is detected. In other words, the process 500 continues until the right wavelength leading to maximum optical power received at the drop port of the MDF is found, which is a good indication of wavelength alignment.

At operation 560, the wavelength compensation for the MDF is completed. For instance, the WDM digital logic controller has generated enough heat from the resistor to shift the MDF resonant wavelength $\lambda_1$ to be aligned with the incident optical wavelength $\lambda_0$. Consequently, the process 500 may end. In some embodiments, the process 500 can be repeatedly performed during operation of the DWDM transceiver, allowing the resonant wavelength MDF to be re-aligned if there is any wavelength shift is later detected.

According to the embodiments, the disclosed circuitry and techniques of for monitoring and tuning resonant wavelengths of a microring drop filter (MDF) can enhance the operation of DWDM photonic receives, and DWDM optical links, in turn. Since DWDM optical link is a key technology that enables energy-efficient high-bandwidth interconnect for high-performance and supercomputing applications, the techniques and circuitry disclosed can to further enhance DWDM-based technology. For example, silicon MDF emerges as a promising candidate for cost-effective DWDM optical receiver. However, there are still technical challenges for silicon MDFs to be deployed in multi-channel DWDM silicon photonic links. The disclose embodiments realize a viable and low-cost solution to closely monitor and tune the resonance wavelengths of the fabricated MDFs, mitigating process variations (which are often are inevitable).

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A multi-channel dense-wavelength-division-multiplexing (DWDM) silicon photonic receiver, comprising:
   an optical receiver, wherein the optical receiver comprises:
      a microring drop filter (MDF) having an incident optical wavelength corresponding to a wavelength from multiple wavelengths for multiple DWDM channels; and
      automatic gain control (AGC) circuitry; and
   circuitry to control and monitor a resonant wavelength of the MDF in real-time and in a manner that compensates for deviation between the resonant wavelength of the MDF and the incident optical wavelength of the MDF, the circuitry comprising a wavelength monitor to detect signals from the optical receiver indicating the resonant wavelength of the MDF;
   wherein the circuitry comprising the wavelength monitor includes a reused portion of the AGC circuitry.

2. The receiver of claim 1, wherein the circuitry comprises a controller to determine an amount of deviation between the resonant wavelength of the MDF and the incident optical wavelength of the MDF based on the detected signals.

3. The receiver of claim 2, wherein the controller determines an amount of deviation between the resonant wavelength of the MDF and the incident optical wavelength of the MDF based on the detected signals.

4. The receiver of claim 3, wherein the controller determines a compensation factor to apply to the MDF to compensate for the deviation between the resonant wavelength of the MDF and the incident wavelength of the MDF.

5. The receiver of claim 4, wherein the compensation factor is a temperature related to thermal wavelength shifting for the MDF.

6. The receiver of claim 4, wherein the compensation factor is a current related to thermal wavelength shifting for the MDF.

7. The receiver of claim 6, wherein the circuitry comprises a wavelength controller to tune the detected resonant wavelength of the MDF via thermal wavelength shifting based on the compensation factor.

8. The receiver of claim 7, wherein the wavelength controller selectively applies current to a resistive heater based on the compensation factor to effectuate tuning the detected resonant wavelength via thermal wavelength shifting.

9. The receiver of claim 8, wherein the resistive heater is proximal to the MDF.

10. A method comprising:
    applying an output code from an analog-to-digital converter (ADC) as a wavelength monitor;
    applying an input code to a digital-to-analog converter (DAC) as a wavelength controller to determine wavelength shifts of a MDF;
    determining a relative location of the MDF resonance wavelength (R) to the incident WDM wavelength ($\lambda$);
    adjusting the resonant wavelength (R) of the MDF until the resonant wavelength (R) of the MDF matches the incident WDM wavelength ($\lambda$);
    setting a DAC input code to a first value ($D_0$);
    storing a first ADC output code ($A_1$) to correspond the first ADC output code ($A_1$) to the first value of the DAC input code ($D_0$);
    setting the DAC input code to a second value for the DAC input code ($D_1$), wherein the second value for the DAC input code ($D_1$) is larger than the first value for the DAC input code ($D_0$) such that the DAC generates a current value corresponding to the second value for the DAC input code ($D_1$) for driving a heating resistor at the MDF that is larger than a current value corresponding to the first value for the DAC input code ($D_0$) by a static step size;
    storing a second ADC output code ($A_2$) to correspond the second ADC output code ($A_2$) to the second value for the DAC input code ($D_1$);
    setting the DAC input code to a third value for the DAC input code ($D_2$), wherein the third value for the DAC input code ($D_2$) is larger than the second value for the DAC input code ($D_1$) such that the DAC generates a current value corresponding to the third value for the DAC input code ($D_2$) for driving the heating resistor at the MDF that is larger than the current value corresponding to the second value for the DAC input code ($D_1$) by a static step size; and
    storing a third ADC output code ($A_3$) to correspond the third ADC output code ($A_3$) to the third value for the DAC input code ($D_2$).

11. The method of claim 10, wherein storing the first ADC output code ($A_1$) corresponds a first resonant wavelength of the MDF to the first value for the DAC input code ($D_0$), storing the second ADC output code ($A_2$) corresponds a second resonant wavelength of the MDF to the second value for the DAC input of ($D_1$), and storing the third ADC output code ($A_3$) corresponds a third resonant wavelength of the MDF to the third value for the DAC input of ($D_2$).

12. The method of claim 11, further comprising:
    determining whether the second resonant wavelength of the MDF is a peak of a monitored signal by comparing the first ADC output code ($A_1$), the second ADC output code ($A_2$), and the third ADC output code ($A_3$).

13. The method of claim 12, wherein comparing the first ADC output code ($A_1$), the second ADC output code ($A_2$) and the third ADC output code ($A_3$) comprises:
    determining if the second ADC output code ($A_2$)>the first ADC output ($A_1$); and
    determining if the third ADC output code ($A_3$)<the second ADC output ($A_2$) to indicate that the second ADC output code ($A_2$) corresponding to the second resonant wavelength of the MDF is the peak of the of the monitored signal.

14. The method of claim 13, further comprising:
    in response to determining that the second ADC output code ($A_2$) is the peak of the monitored signal, setting the second ADC output code ($A_2$) as the received optical power (P); and
    measuring the optical power (P) at a drop port of the MDF to determine an amount of deviation between the MDF resonant wavelength R and the incident optical wavelength $\lambda$.

15. The method of claim 14, wherein adjusting the resonant wavelength (R) of the MDF until the resonant wavelength (R) of the MDF matches the incident WDM wavelength ($\lambda$) comprises using the measured optical power (P)

at a drop port of a MDF to determine that there is no difference between the resonant wavelength (R) of the MDF and the incident wavelength (λ) of the MDF.

16. A multi-channel dense-wavelength-division-multiplexing (DWDM) silicon photonic receiver, comprising:
- an optical receiver, wherein the optical receiver comprises a microring drop filter (MDF) having an incident optical wavelength corresponding to a wavelength from multiple wavelengths for multiple DWDM channels;
- a wavelength monitor to detect signals from the optical receiver indicating a resonant wavelength of the MDF;
- a wavelength division multiplexing (WDM) digital logic controller to determine an amount of deviation between the resonant wavelength of the MDF and the incident optical wavelength of the MDF based on the detected signals; and
- a wavelength controller to tune the resonant wavelength of the MDF via thermal wavelength shifting based on the compensation factor;
- wherein the wavelength monitor comprises a peak detector and a direct current (dc) detector by reusing circuitry of an automatic gain control (AGC) portion of the optical receiver.

17. The receiver of claim 16, wherein the peak detector senses a peak of a voltage signal of the optical receiver as fine monitoring of the voltage signal, and the dc detector senses a dc voltage of the optical transceiver as coarse monitoring of the voltage signal in order to detect a peak of the resonant wavelength corresponding to wavelength spaced from the other multiple wavelengths for the multiple DWDM channels.

* * * * *